(12) United States Patent
Maa et al.

(10) Patent No.: US 7,279,400 B2
(45) Date of Patent: Oct. 9, 2007

(54) METHOD OF FABRICATING SINGLE-LAYER AND MULTI-LAYER SINGLE CRYSTALLINE SILICON AND SILICON DEVICES ON PLASTIC USING SACRIFICIAL GLASS

(75) Inventors: Jer-Shen Maa, Vancouver, WA (US); Jong-Jan Lee, Camas, WA (US); Douglas J. Tweet, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 226 days.

(21) Appl. No.: 10/913,677

(22) Filed: Aug. 5, 2004

(65) Prior Publication Data
US 2006/0030124 A1 Feb. 9, 2006

(51) Int. Cl.
*H01L 21/30* (2006.01)
*H01L 21/46* (2006.01)
(52) U.S. Cl. .................. 438/458; 438/528; 438/977
(58) Field of Classification Search ............ 438/458, 438/977, 527, 528, 997
See application file for complete search history.

(56) References Cited

U.S. PATENT DOCUMENTS

| | | | |
|---|---|---|---|
| 6,451,216 B1* | 9/2002 | Silverbrook | 216/27 |
| 6,524,935 B1* | 2/2003 | Canaperi et al. | 438/478 |
| 6,562,703 B1* | 5/2003 | Maa et al. | 438/518 |
| 6,793,731 B2* | 9/2004 | Hsu et al. | 117/3 |
| 6,841,457 B2* | 1/2005 | Bedell et al. | 438/479 |
| 6,992,025 B2* | 1/2006 | Maa et al. | 438/795 |
| 2001/0015256 A1* | 8/2001 | Yamazaki et al. | 156/289 |
| 2004/0087119 A1* | 5/2004 | Maa et al. | 438/518 |
| 2004/0224482 A1* | 11/2004 | Kub et al. | 438/458 |
| 2005/0070115 A1* | 3/2005 | Maa et al. | 438/706 |
| 2005/0095810 A1* | 5/2005 | Nakata et al. | 438/455 |
| 2006/0019464 A1* | 1/2006 | Maa et al. | 438/458 |
| 2006/0063356 A1* | 3/2006 | Park et al. | 438/459 |

OTHER PUBLICATIONS

Asano et al., *Low-Temperature Polycrystalline-Silicon TFT Color LCD Panel Made of Plastic Substrates*, SID Digest, p. 1196 (2002).

(Continued)

*Primary Examiner*—Zandra V. Smith
*Assistant Examiner*—Seth Barnes
(74) *Attorney, Agent, or Firm*—David C. Ripma

(57) ABSTRACT

A method of fabricating a silicon-on-plastic layer via layer transfer includes depositing a layer of SiGe on a silicon substrate; depositing a layer of silicon; implanting splitting hydrogen ions into the silicon substrate; bonding a glass substrate to the silicon layer; splitting the wafer; removing the silicon layer and a portion of the SiGe layer; depositing a dielectric on the silicon side of the silicon-on-glass wafer; applying adhesive and bonding a plastic substrate to the silicon side of the silicon-on-glass wafer; removing the glass from the glass side of the bonded, silicon-on-glass wafer to form a silicon-on-plastic wafer; and completing a desired IC device on the silicon-on-plastic. Multi-level structure may be fabricated according to the method of the invention by repeating the last few steps of the method of the invention.

13 Claims, 7 Drawing Sheets

OTHER PUBLICATIONS

Okada et al., *A 4-in Reflective Color TFT-LCD Using a Plastic Substrate*, SID Digest, p. 1204 (2002).

Yoshida et al., *3-inch Full-color OLED Display using a Plastic Substrate*, SID Digest, p. 856 (2003).

Wang et al., *Device Transfer Technology by Backside Etching for Poly-Si Thin-Film Transistors on Glass/Plastic Substrate*, Jpn. J. Appl. Phys., 42, L 1044 (2003).

\* cited by examiner

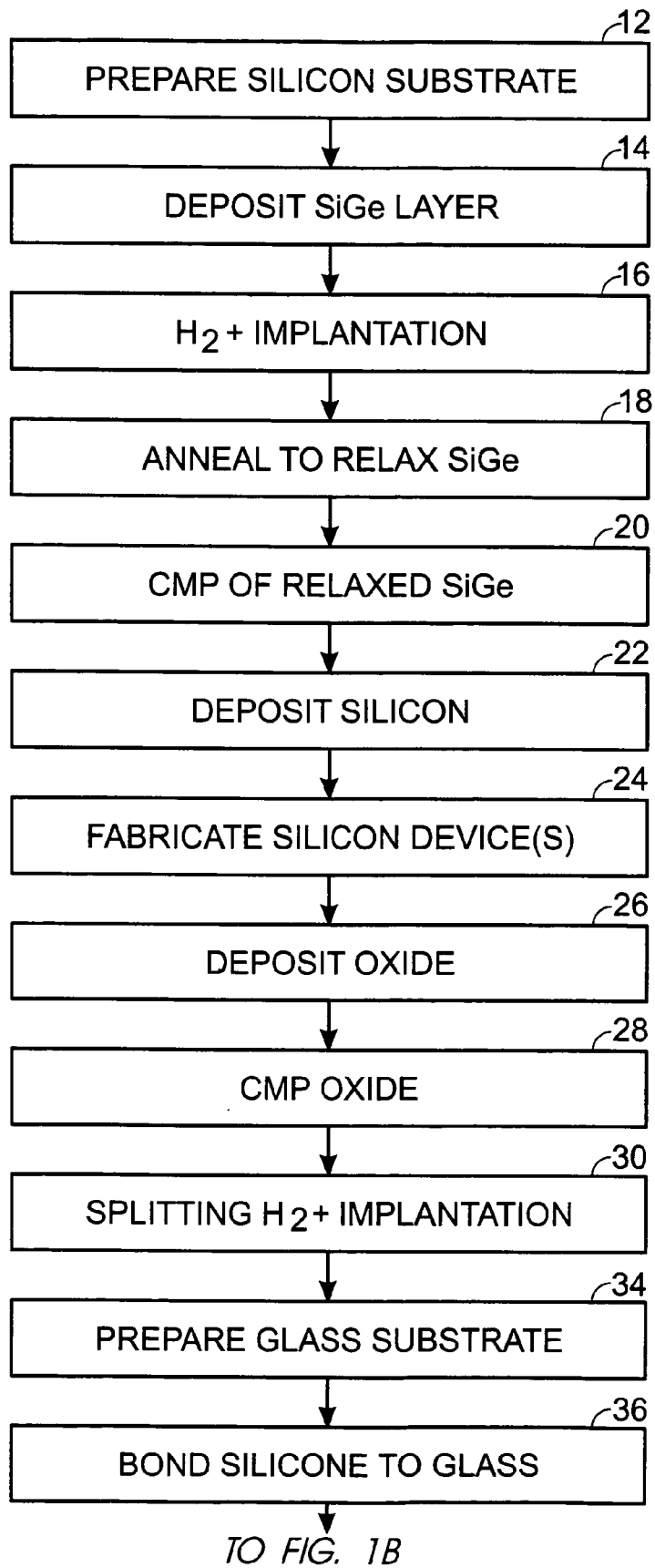

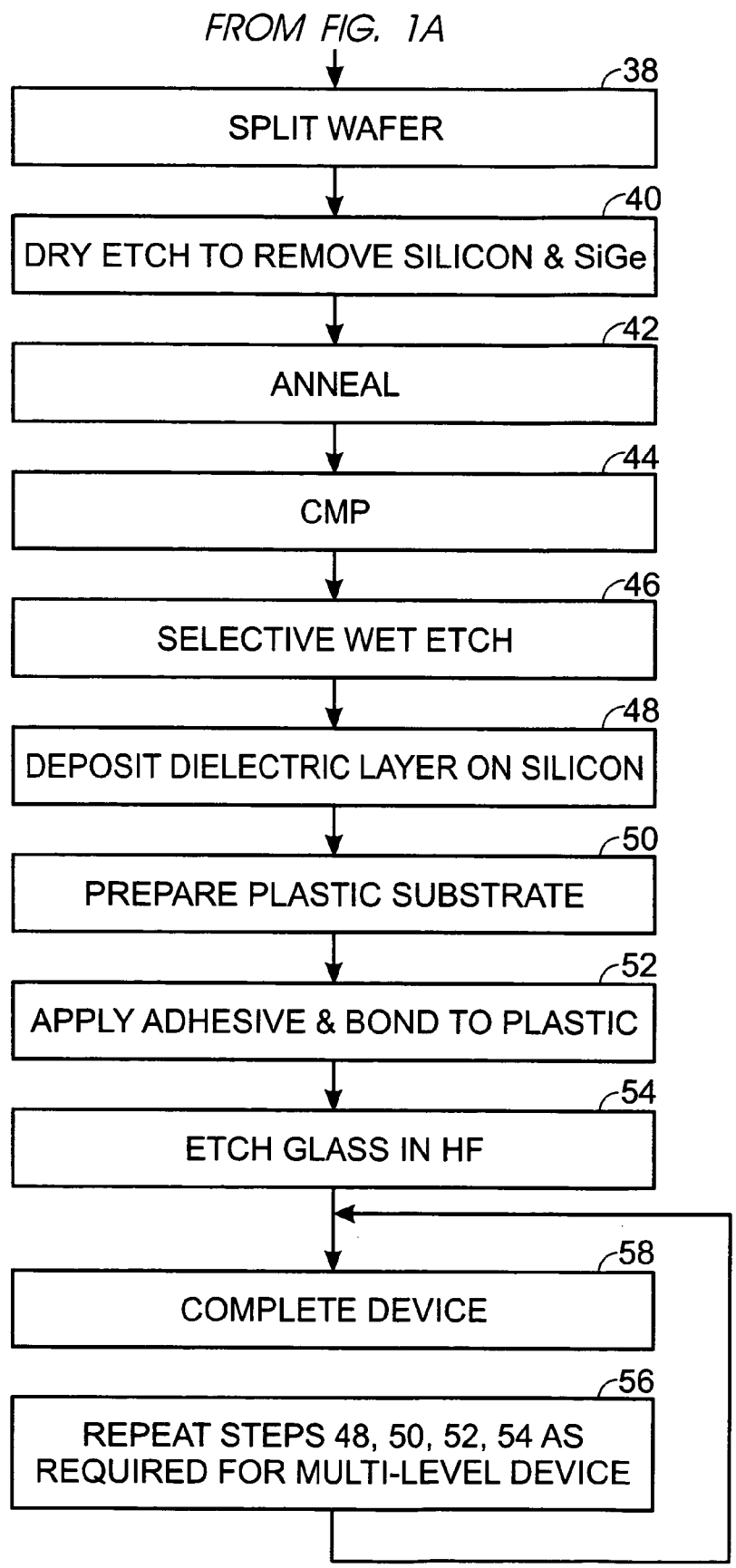

METHOD OF FABRICATING SINGLE-LAYER AND MULTI-LAYER SINGLE CRYSTALLINE SILICON AND SILICON DEVICES ON PLASTIC USING SACRIFICIAL GLASS

FIELD OF THE INVENTION

This invention relates to fabrication of silicon-on-plastic, for display, sensor and mobile devices applications.

BACKGROUND OF THE INVENTION

The introduction of mobile devices, such as cellular phones, PDAs, electronic books, electronic newspapers, portable TV, etc., the use of thin film devices on plastic has dramatically increased. Devices fabricated on plastic are light weight, thinner than glass, and generally unbreakable. The most noticeable progress is the development of organic light emitting diode (OLED) display on plastic substrate was reported by Yoshida et al., *3-inch Full-color OLED Display using a Plastic Substrate*, SID Digest, p. 856 (2003), however, the quality and resolution of the disclosed OLED display still requires further improvement to compete with silicon-based thin-film transistor (TFT) technology.

Another approach is to fabricate TFTs directly on plastic substrate, as described by Okada et al., *A 4-in Reflective Color TFT-LCD Using a Plastic Substrate*, SID Digest, p. 1204 (2002), however, this process requires a fabrication temperature which must be lowered to 220° C. to avoid thermal damage to the plastic. TFT were fabricated using a-Si:H deposited at 220° C., however, the mobility and image quality are much less than a polysilicon TFT.

Polycrystalline-silicon TFTs have been fabricated on a plastic substrate using a film transfer process, as reported by Asano et al., *Low-Temperature Polycrystalline-Silicon TFT Color LCD Panel Made of Plastic Substrates*, SID Digest, p. 1196 (2002). The reported procedure includes: (1) fabricating the bottom gate TFT device on a glass substrate, with a gate insulating layer and an amorphous silicon (a-Si) layer, (2) the a-Si is crystallized in an excimer laser annealing system, (3) completing the TFT process, (4) gluing the completed TFT to a second, temporary substrate, (5) etching to remove the glass by hydrofluoric acid, (6) affixing a plastic substrate to the rear surface of the TFT with a permanent adhesive, and (7) detaching the temporary substrate.

Wang et al. reported the direct transfer of poly-Si TFT from silicon to a glass or to a plastic substrate, Wang et al., *Device Transfer Technology by Backside Etching for Poly-Si Thin-Film Transistors on Glass/Plastic Substrate*, Jpn. J. Appl. Phys., 42, L 1044 (2003). The steps in this technique include (1) fabricating a poly-Si TFT on a silicon substrate, (2) gluing the front side to a glass/plastic substrate, and (3) removing the silicon wafer by CMP and wet etching.

SUMMARY OF THE INVENTION

A method of fabricating a silicon-on-glass layer via layer transfer includes preparing a silicon substrate; depositing a layer of SiGe on the silicon substrate; depositing a layer of silicon on the SiGe layer; depositing a layer of insulator on the silicon layer; implanting splitting hydrogen ions into the silicon substrate; preparing a glass substrate; bonding the glass substrate to the silicon layer to form a composite wafer; splitting the composite wafer to provide a split wafer having, in seriatim, a glass substrate, a layer of silicon; a layer of SiGe; and silicon layer split from the silicon substrate; dry etching the split wafer to remove the silicon layer split from the silicon substrate and a portion of the SiGe layer; annealing the split wafer to increase the bond between the silicon and the glass substrate; selectively etching the split wafer to remove any remaining SiGe, thereby forming a silicon-on-glass wafer having a glass side and a silicon side; depositing a dielectric on the silicon side of the silicon-on-glass wafer; preparing a plastic substrate; applying adhesive and bonding the plastic to the silicon side of the silicon-on-glass wafer; removing the glass from the glass side of the bonded, silicon-on-glass wafer to form a silicon-on-plastic wafer; and completing a desired IC device on the silicon-on-plastic. Multi-layer silicon-on-plastic devices and substrates may be fabricated according to the method of the invention by repeating the last few steps of the method of the invention.

It is an object of the invention to fabricate single crystalline silicon and silicon devices on a plastic substrate, wherein the silicon may be either strained or unstrained.

Another object of the invention is to provide for formation and transfer of a silicon layer which is first formed on a relaxed SiGe layer by hydrogen-implantation-induced relaxation.

Another object of the method of the invention is to provide a single layer silicon-on-plastic device or substrate.

A further object of the method of the invention is to provide a multi layer silicon-on-plastic device or substrate.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 1 is a block diagram of the method of the invention.

DETAILED DESCRIPTION OF THE PREFERRED EMBODIMENTS

Unlike the above-identified prior art methods, a process is described herein to fabricate a high quality thin single crystalline silicon and silicon-based devices, and to then transfer the silicon, or silicon-based, device onto a plastic substrate.

The method of the invention includes fabrication of a single crystalline silicon layer and silicon-based devices on plastic substrate. The silicon may be either strained or unstrained. A strained silicon layer is first formed on a relaxed SiGe layer by hydrogen-implantation-induced relaxation. The strained silicon film is transferred to a sacrificial glass substrate by direct wafer bonding and hydrogen induced exfoliation. The method of the invention is similar to that described in Ser. No. 10/894,685, filed Jul. 20, 2004, for *Method of Fabricating Silicon-on-glass via Layer Transfer*, which disclosure is incorporated herein by reference, however, the additional steps described herein result in a single, or multi, level silicon layer, or silicon-based device, formed on a plastic substrate. After applying adhesive, the film is glued to a plastic substrate. The glass is then dissolved in hydrofluoric acid. The final structure is silicon-on-plastic.

Because of the low process temperature required for fabrication of anything on plastic, a silicon-based device is first fabricated on a Si/SiGe/bulk silicon substrate. After hydrogen exfoliation, the device structure, together with SiGe, and a portion of the silicon substrate, are transferred to glass substrate. Adhesive is applied to the wafer surface and bonded to plastic. The glass is then dissolved in hydrofluoric acid.

The method of the invention makes it possible to fabricate advanced devices on inexpensive plastic substrates. The current need of mobile devices will benefit from the improved silicon quality disclosed in this invention. The method of the invention is suitable for forming silicon on flexible plastic sheets and for forming silicon on thick plastic material.

Strained Silicon Device Fabrication

Figure 2:
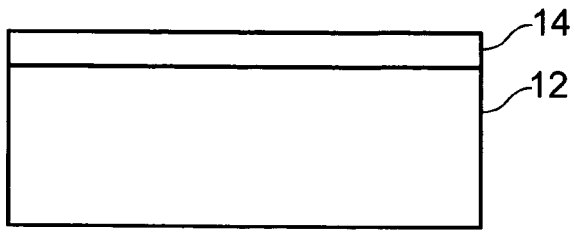
FIG. 2-14 depicts successive steps in the method of the invention.
Figure 3:
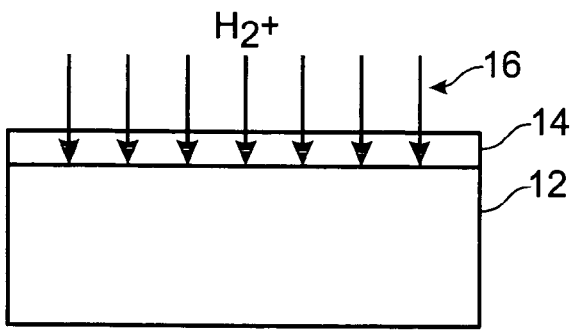
Figure 4:
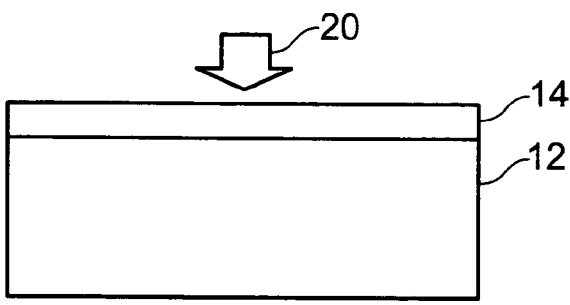

The steps of the method of the invention, and now referring to FIG. 1 and FIGS. 2-14, is depicted generally at 10 in FIG. 1. Initially, and now referring to FIGS. 1 and 2, a suitable silicon substrate is prepared, 12, which substrate is most likely bulk silicon. A layer of SiGe is deposited, 14, to a thickness of between about 40 nm to 500 nm, as shown in FIG. 3. A first, or relaxation, $H_2^+$ implantation is performed, 16, FIG. 3, at an energy of between about 10 KeV to 100 KeV and at a dose of between about $2 \cdot 10^{-14}$ cm$^{-2}$ to $2 \cdot 10^{16}$ cm$^{-2}$, to implant hydroge the SiGe layer. The substrate and SiGe layer are annealed at a temperature of between about 250° C. to 1000° C. for between about six seconds to four hours, 18, in order to relax the hydrogen-implanted SiGe layer. The relaxed SiGe layer is smoothed by CMP, 20, FIG. 4, and then cleaned.

Figure 5:
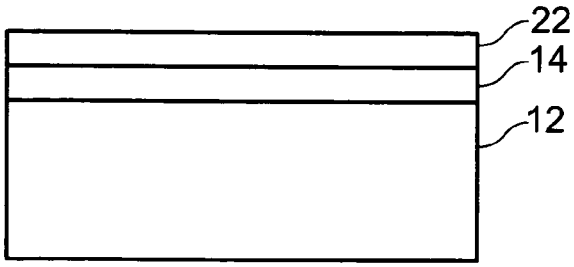

In this embodiment of the method of the invention, a layer of strained silicon is deposited, 22, FIG. 5 to a thickness of between about 10 nm to 50 nm. At this point, IC devices may be fabricated on the strained silicon layer, 24, which devices are not shown, but which will be understood by those of ordinary skill in the art to include any number of devices, such as transistors, diodes, resistors, etc.

Figure 6:
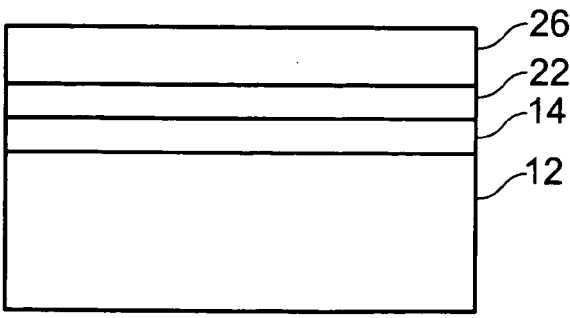

A layer of insulator material, such as silicon dioxide, is deposited, 26, FIG. 6, on the strained silicon to a thickness of between about 1.5 to 2 times that of the strained silicon material. The oxide layer is smoothed by CMP to planarize the deposited oxide layer, 28.

Figure 7:
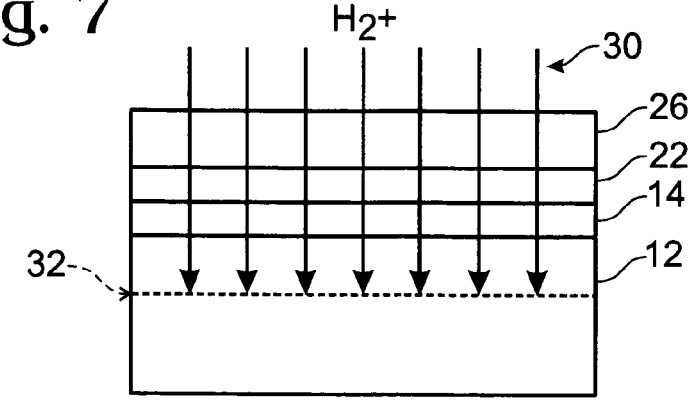

A second, or splitting, $H_2^+$ implantation step 30, prepares the strained silicon/SiGe/silicon substrate for wafer splitting, FIG. 7. The implant depth 32 is targeted to a depth of 300 nm to 500 nm below the bulk Si/SiGe interface, at an energy of about 140 keV and a $H_2^+$ dose of about $4 \cdot 10^{16}$ cm$^{-2}$.

A glass substrate is prepared, 34. As will be understood by those of ordinary skill in the art, preparation of glass substrate 34, as used herein means preparation of a plain glass substrate, or preparation of a glass substrate coated with an insulating layer, such as an oxide layer, which insulating layer may be formed by any deposition method, such as plasma deposition, CVD, sputtering, or other state-of-the art deposition method. The oxide/strained silicon/SiGe/silicon substrate is bonded, 36, FIG. 8, to the glass substrate, after proper surface treatment to make the surface of the glass substrate hydrophilic, such as treatment with a dilute SC-1 solution to form a composite wafer.

Figure 8:
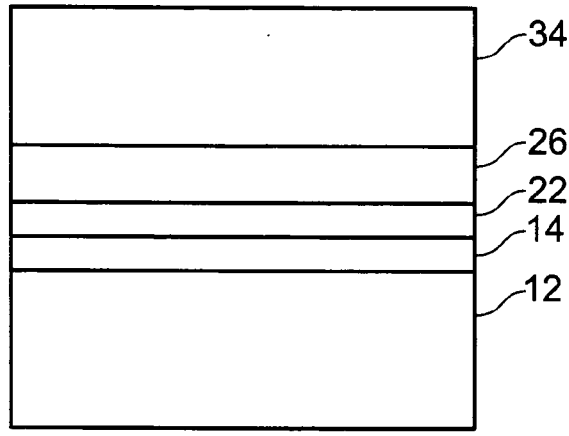
Figure 9:
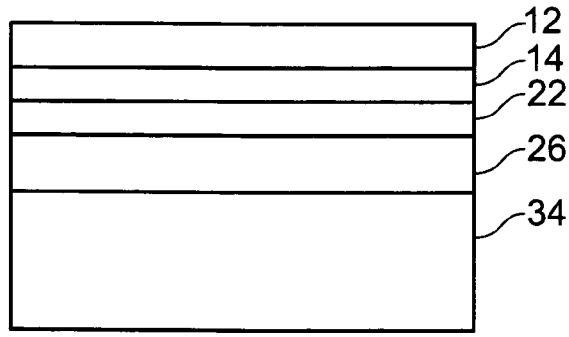
Figure 10:
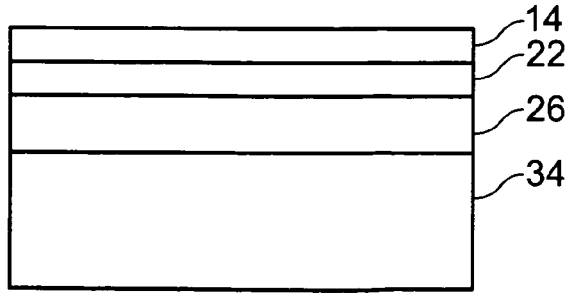
Figure 11:
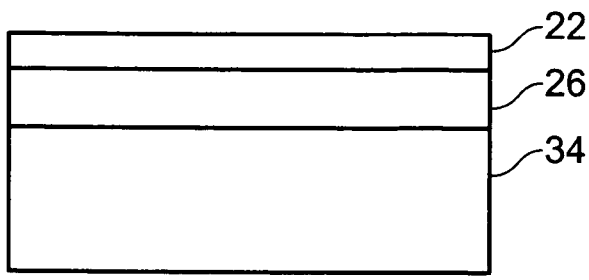
Figure 12:
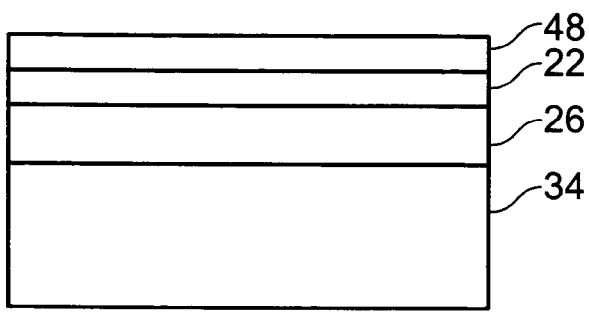

The wafer is split, 38, along the line of the splitting $H_2^+$ implant 32, by heating to a split temperature of below 450° C., for example 375° C., to avoid film blistering, and an anneal time of between about one to three hours, resulting in the structure of FIG. 9, which is inverted from that of FIG. 8. The portion of the wafer having the relaxed SiGe layer therein, the split wafer, is dry etched 40 to remove the silicon substrate and part of the SiGe layer to ensure that blistering will not occur in a subsequent anneal step, which is performed to strengthen the bond between the glass and the SiGe layer, FIG. 10. One of ordinary skill in the art will appreciate that a wet etch is not appropriate for this step as a wet etch may result in a lifting of the film because of the weakness of the initial bond. The wafer is annealed, 42, in a bond-strengthening anneal, at a temperature of between about 500° C. to 650° C. for between about ten minutes to 120 minutes, to increase the bonding force between the strained silicon and glass so that the bond between the strained silicon and glass is strong enough to withstand the following steps. The wafer is CMPd 44 to smooth the split surface, however, this step may be omitted if the etch selectivity between SiGe and silicon in SC-1 solution results in a sufficiently smooth surface. The wafer is now wet etched, selectively 46, to remove the SiGe layer, for example in SC-1 solution, resulting in the structure of FIG. 11. A dielectric layer is deposited 48 on the silicon layer as an isolation layer to plastic, FIG. 12. The dielectric layer may be taken from the group of dielectrics consisting of oxides, nitrites, or TEOS (tetraethylorthosilicate oxide (oxane)), and may be deposited by any well-known method, such as CVD, sputtering and other state-of-the-art techniques.

A plastic substrate is next prepared 50. The plastics used for practicing the method of the invention any heat-resistance plastic, e.g., capable of retaining structural integrity at temperatures up to 300° C. Preparation includes washing the plastic with a soap, and rinsing with de-ionized water. A layer of adhesive 52 is applied to the plastic or to the dielectric layer, or to both layers, which are then bonded to one another, FIG. 13. The structure is etched in hydrofluoric acid to remove the remaining glass, 54, FIG. 14, and the device completed by well-known state-of-the-art processes, 58. Steps 48 through 54, inclusive, may be repeated, step 56, as required to fabricate a multi-level substrate of device, which variation to the method of the invention will be further described later herein.

Although the focus of this invention is the fabrication of a silicon device on plastic, a similar approach may be applied to the fabrication of a silicon device on glass. Following the step where a silicon device is fabricated on Si/SiGe/bulk silicon, the entire structure may be transferred to a glass substrate using hydrogen exfoliation and direct wafer bonding. If the process is terminated at this step, the structure is silicon-on-glass.

The preferred embodiment previously described uses an example of the transfer of strained silicon, however, a similar approach may be used to fabricate a device on unstrained silicon and apply the devise to a plastic sheet. In the case of unstrained silicon, the steps of SiGe relaxation by hydrogen implantation and subsequent annealing are omitted, and the CMP of the SiGe layer, to remove any surface ripple structure induced during relaxation, is not required.

Unstrained Silicon Device Fabrication

Referring to FIGS. 2-14, again; a suitable silicon substrate is prepared, 12. A layer of SiGe is deposited, 14, to a thickness of between about 40 nm to 500 nm, and is not relaxed. A layer of unstrained silicon is deposited, 22, to a thickness of between about 10 nm to 50 nm. At this point, IC devices may be fabricated on the unstrained silicon layer, 24, which devices are not shown, but which will be understood by those of ordinary skill in the art to include any number of devices, such as transistors, diodes, resistors, etc.

A splitting $H_2^+$ implantation step 30, prepares the unstrained silicon/SiGe/silicon substrate for wafer splitting. The implant depth is targeted to a depth of 300 nm to 500 nm below the bulk Si/SiGe interface 32, at an energy of about 140 keV and a $H_2^+$ dose of about $4\cdot10^{16}$ cm$^{-2}$.

A glass substrate is prepared, 34. As will be understood by those of ordinary skill in the art, preparation of glass substrate 34, as used herein means preparation of a plain glass substrate, or preparation of a glass substrate coated with an insulating layer, such as an oxide layer, which insulating layer may be formed by any deposition method, such as plasma deposition, CVD, sputtering, or other state-of-the art deposition method. The oxide/unstrained silicon/SiGe/silicon substrate is bonded, 36, to the glass substrate, after proper surface treatment to make the surface of the glass substrate hydrophilic, such as treatment with a dilute SC-1 solution. Those of ordinary skill in the art will appreciate that the silicon layer, or silicon-based device, may be formed glass or on silicon prior to its transfer to the plastic substrate.

The wafer is split, 38, along the line of the splitting $H_2^+$ implant 32, by heating to a split temperature of below 450° C., for example 375° C., to avoid film blistering, and an anneal time of between about one to three hours. The wafer portion having the SiGe layer is dry etched 40 to remove the unstrained silicon layer and part of the SiGe layer to ensure that blistering will not occur in a subsequent anneal step, which is performed to strengthen the bond between the glass and the SiGe layer. The wafer is annealed, 42, to increase the bonding force between the glass and the unstrained silicon so that the bond is strong enough to withstand the following steps. The wafer is CMPd 44 to smooth the split surface, however, this step may also be omitted if the etch selectivity between SiGe and silicon in SC-1 solution results in a sufficiently smooth surface. The wafer is now wet etched, selectively 46, to remove the SiGe layer, for example in SC-1 solution. A dielectric layer is deposited on the silicon layer 48 as an isolation layer to plastic.

A plastic substrate is next prepared 50, as previously described herein. A layer of adhesive is applied to the dielectric layer or plastic substrate, or to both, which are then bonded to one another, 52. The structure is etched in hydrofluoric acid to remove the remaining glass, 54, and the device completed by well-known state-of-the-art processes, 58.

Figure 15:
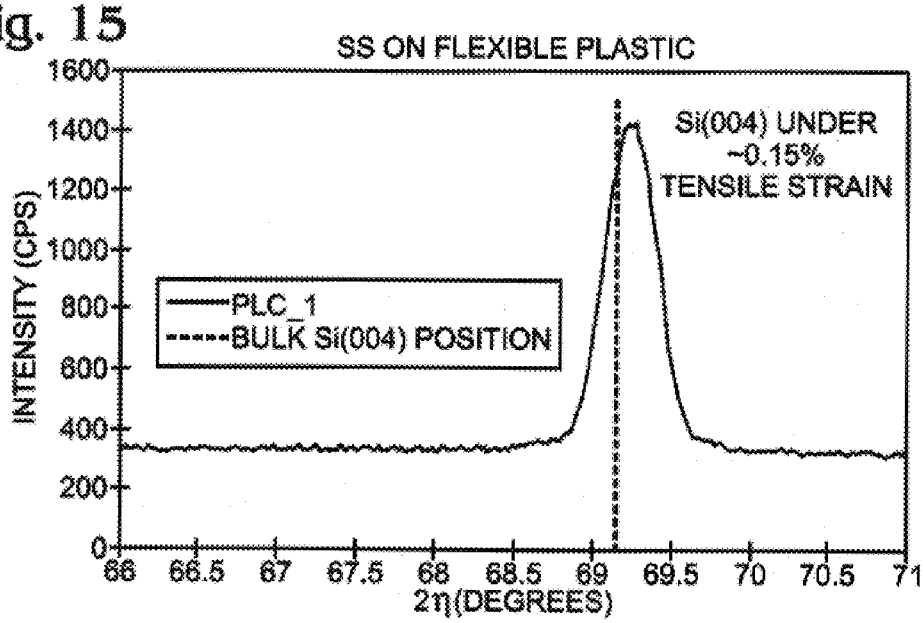
FIG. 15 is an XRD of SiGe/Si on a plastic substrate.
Figure 16:
FIG. 16 is a Normarski image of SiGe on thin, flexible plastic sheet.
Figure 17:
FIG. 17 is a Normarski image of SiGe on a thick plastic sheet.

The transfer of SiGe and silicon onto plastic substrates is confirmed by XRD, as shown in FIG. 15, which clearly shows the single crystal silicon peak from a sample of silicon-on-plastic substrate. Normarski inspection of the SiGe transferred onto flexible plastic sheet revealed some crack formation due to the bending of the plastic sheet. However, no crack was detected on the silicon which was transferred onto a thicker plastic surface. These are shown in FIGS. 16 and 17. These preliminary results demonstrate the feasibility of film transfer to plastic substrates. As used herein, "thin" means a plastic substrate which is bendable, flexible; "thick" means a plastic substrate which is rigid.

To fabricate a multilevel structure according to the method of the invention, the final few steps of the method of the invention for fabrication of a single layer silicon-on-plastic layer or device are repeated by applying an adhesive layer to a second silicon-on-glass split wafer, then attaching he first silicon-on-plastic structure to the second silicon-on-glass wafer, and etching most of the glass in an HF solution. This process may be repeated to as many times as needed, thus fabricating a multilevel silicon-on-plastic substrate.

Figure 13:
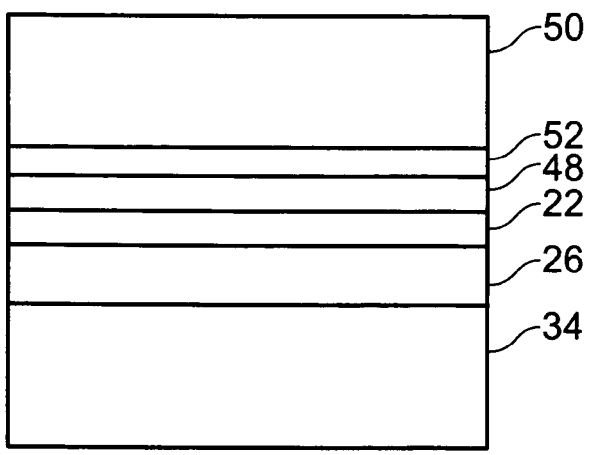
Figure 14:
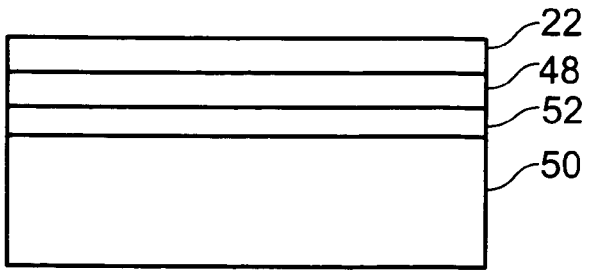

In the Fabrication of a multi-level structure, steps 48, 40, 52 and 54 of FIG. 1 are repeated, step 56, as required to form a plastic substrate having the desired number of levels or devices thereon. A silicon-on-glass structure is fabricated according to the method of the invention, and split, as previously described. Referring to FIG. 13, an adhesive layer is applied to the second silicon-on-glass structure, and the silicon-on-plastic substrate is attached to the second silicon-on-glass substrate. Again, most of the glass is removed by etching in an HF solution. These steps may be repeated to as many times as needed to fabricate a multilevel silicon structure on a plastic substrate, or to form a silicon-on-plastic substrate having any number of layers therein.

Figure 18:
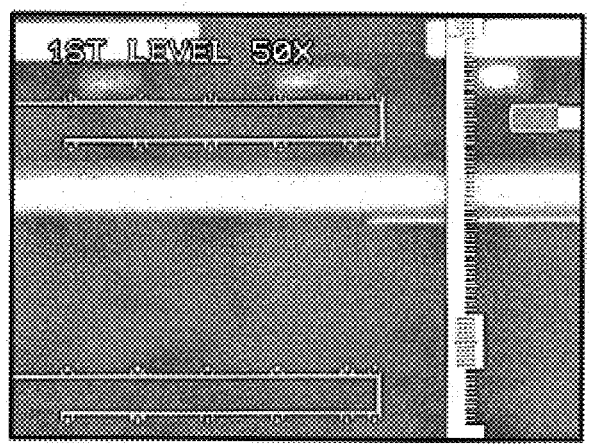
FIGS. 18-20 depict multi-level structures fabricated according to the method of the invention.
Figure 19:
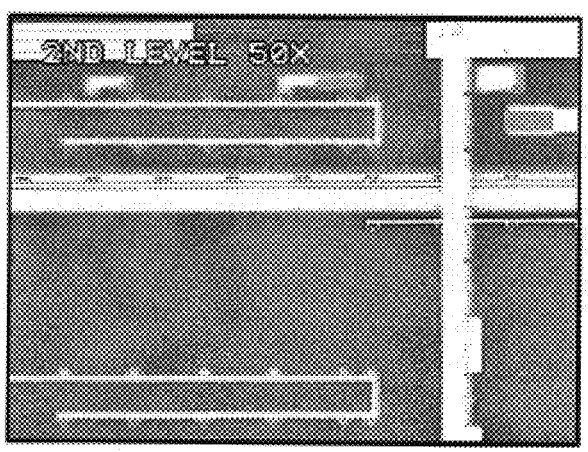
Figure 20:
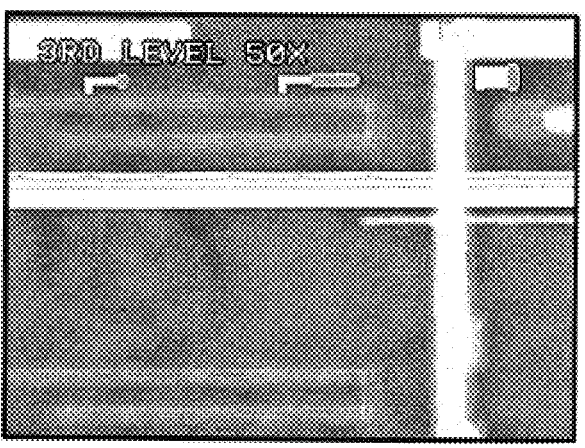

A sample was constructed having four levels of silicon structure. This sample is shown in FIGS. 18-20. FIG. 18 depicts the first layer of silicon-on-plastic, which is located immediately below the top surface of the structure. FIG. 19 depicts the next lower layer, while FIG. 20 depicts the first-formed layer of the structure.

As with the single level silicon-on-plastic, a similar fabrication method may be used to fabricate a silicon device on glass. The devices may be fabricated on silicon, SiGe, or bulk silicon. The entire structure may then be transferred to a glass substrate using hydrogen exfoliation and direct wafer bonding, as described above.

Although the transfer of strained silicon is uses as an example for this phase of the method of the invention, a similar approach may be used to form a structure incorporating an unstrained silicon layer(s). In this case, the steps of SiGe relaxation by hydrogen implantation and annealing are omitted, and the CMP step to remove the surface ripple structure by relaxation is also not required.

Thus, a method of fabricating single crystalline silicon and silicon devices on plastic using sacrificial glass has been disclosed. It will be appreciated that further variations and modifications thereof may be made within the scope of the invention as defined in the appended claims.

We claim:

1. A method of fabricating a silicon-on-plastic layer via layer transfer comprising:

seriatim preparing a silicon substrate;

depositing a layer of SiGe on the silicon substrate;

depositing a layer of strained silicon on the SiGe layer;

depositing a layer of insulator on the silicon layer;

implanting splitting hydrogen ions into the silicon substrate;

preparing a glass substrate;

bonding the glass substrate to the silicon layer to form a composite wafer;

splitting the composite wafer to provide a split wafer having, in seriatim, a glass substrate, a layer of strained silicon; a layer of SiGe; and silicon layer split from the silicon substrate;

dry etching the split wafer to remove the silicon layer split from the silicon substrate and a portion of the SiGe layer;

annealing the split wafer to increase the bond between the silicon and the glass substrate;

selectively etching the split wafer to remove any remaining SiGe, thereby forming a silicon-on-glass wafer having a glass side and a silicon side;

depositing a dielectric on the silicon side of the silicon-on-glass wafer;
preparing a plastic substrate;
applying adhesive and bonding the plastic to the silicon side of the silicon-on-glass wafer;
removing the glass from the glass side of the bonded, silicon-on-glass wafer to form a silicon-on-plastic wafer; and
completing a desired IC device on the silicon-on-plastic.

2. The method of claim 1 wherein said depositing a layer of SiGe includes depositing a layer of SiGe to a thickness of between about 40 nm to 50 nm.

3. The method of claim 1 wherein said depositing a layer of silicon includes depositing a layer of silicon to a thickness of between about 10 nm to 50 nm.

4. The method of claim 1 wherein said splitting includes annealing the composite wafer at a temperature of less than 450° C. to avoid blistering of the silicon/SiGe/silicon layer, for between about one hour to three hours.

5. The method of claim 1 wherein said splitting hydrogen implantation includes implanting $H_2^+$ ions to an implant depth of between about 300 nm to 500 nm below the Si/SiGe interface, at an energy of about 140 keV, and a dose of about $4 \cdot 10^{16}$ cm$^{-2}$.

6. The method of claim 1, which further includes, after said depositing a layer of SiGe on the silicon substrate, implanting hydrogen ions into the silicon substrate through the SiGe layer in a relaxation hydrogen implantation step; annealing the silicon substrate and SiGe layer in a first annealing step to relax the SiGe layer; thereby forming a relaxed SiGe layer; and smoothing the relaxed SiGe layer; implanting hydrogen ions in a splitting hydrogen implantation step through the strained silicon layer to facilitate splitting of the wafer; and wherein in said splitting includes splitting the composite wafer to provide a split wafer having, in seriatim, a glass substrate, a layer of strained silicon; a layer of relaxed SiGe; and silicon layer split from the silicon substrate.

7. The method of claim 6 wherein said relaxation hydrogen implantation includes implanting $H_2^+$ ions are implanted at an energy of between about 10 KeV and 100 KeV, at a dose of between about $2 \cdot 10^{14}$ cm$^{-2}$ to $2 \cdot 10^{16}$ cm$^{-2}$.

8. The method of claim 6 wherein said depositing a layer of strained silicon includes depositing a layer of strained silicon to a thickness of between about 10 nm to 50 nm.

9. The method of claim 6 wherein said first annealing step includes annealing the composite wafer at a temperature of less than 450° C. to avoid blistering of the silicon/SiGe/silicon layer, for between about one hour to three hours.

10. The method of claim 1 wherein said preparing a glass substrate includes preparing a substrate taken from the group of substrate preparations consisting of preparing a plain glass substrate and preparing a glass substrate coated with an insulating layer, wherein the insulating layer is deposited by a deposition method taken from the group of deposition methods consisting of plasma deposition, CVD, sputtering, and other state-of-the art deposition methods.

11. The method of claim 10 wherein the insulating layer may be formed to a thickness of between about 10 nm to 1 µm.

12. The method of claim 1 wherein preparing a plastic substrate includes washing the plastic substrate and rinsing the washed plastic substrate in de-ionized water.

13. The method of claim 1 wherein the steps of:
preparing a glass substrate;
bonding the glass substrate to the silicon layer to form a composite wafer;
splitting the composite wafer to provide a split wafer having, in seriatim, a glass substrate, a layer of silicon; a layer of SiGe; and silicon layer split from the silicon substrate;
dry etching the split wafer to remove the silicon layer split from the silicon substrate and a portion of the SiGe layer;
annealing the split wafer to increase the bond between the silicon and the glass substrate;
selectively etching the split wafer to remove any remaining SiGe, thereby forming a silicon-on-glass wafer having a glass side and a silicon side;
depositing a dielectric on the silicon side of the silicon-on-glass wafer;
preparing a plastic substrate;
applying adhesive and bonding the plastic to the silicon side of the silicon-on-glass wafer; and
removing the glass from the glass side of the bonded, silicon-on-glass wafer to form a silicon-on-plastic wafer, are repeated to form a multi-level silicon-on-plastic structure.

* * * * *